United States Patent
Eto et al.

(10) Patent No.: US 7,599,244 B2
(45) Date of Patent: Oct. 6, 2009

(54) SEMICONDUCTOR MEMORY, MEMORY CONTROLLER AND CONTROL METHOD FOR SEMICONDUCTOR MEMORY

(75) Inventors: Satoshi Eto, Kawasaki (JP); Kuninori Kawabata, Kawasaki (JP); Toshiya Miyo, Kawasaki (JP); Yuji Serizawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 42 days.

(21) Appl. No.: 11/437,719

(22) Filed: May 22, 2006

(65) Prior Publication Data
US 2007/0177449 A1    Aug. 2, 2007

(30) Foreign Application Priority Data
Jan. 30, 2006    (JP) .............................. 2006-020427

(51) Int. Cl.
*G11C 8/00*    (2006.01)
(52) U.S. Cl. .................. 365/233.1; 365/193; 365/222
(58) Field of Classification Search ................ 365/222, 365/233, 233.1, 196
See application file for complete search history.

(56) References Cited

U.S. PATENT DOCUMENTS

| | | | |
|---|---|---|---|
| 5,905,690 A | | 5/1999 | Sakurai et al. |
| 6,006,290 A | | 12/1999 | Suh |
| 6,222,785 B1 | * | 4/2001 | Leung .......................... 365/222 |
| 2001/0038565 A1 | * | 11/2001 | Matsuzaki .................... 365/222 |
| 2002/0018394 A1 | * | 2/2002 | Takahashi ..................... 365/233 |
| 2003/0053362 A1 | | 3/2003 | Kawaguchi et al. |
| 2003/0126356 A1 | | 7/2003 | Gustavson et al. |
| 2004/0081012 A1 | * | 4/2004 | Setogawa ..................... 365/233 |
| 2005/0265086 A1 | * | 12/2005 | Takano et al. ........... 365/189.05 |
| 2006/0164894 A1 | * | 7/2006 | Wan et al. ..................... 365/201 |

FOREIGN PATENT DOCUMENTS

| | | |
|---|---|---|
| JP | 11-149771 A | 6/1999 |
| JP | 2003-168292 A | 6/2003 |
| WO | WO 00/20954 | 4/2000 |

OTHER PUBLICATIONS

European Official Communication dated Feb. 12, 2008, 3 pages.

* cited by examiner

*Primary Examiner*—Vu A Le
*Assistant Examiner*—Han Yang
(74) *Attorney, Agent, or Firm*—Arent Fox LLP.

(57) ABSTRACT

A semiconductor memory for inputting and outputting data synchronously with a clock includes a clock reception unit for receiving the clock, and a command reception unit for initially receiving a first specific command synchronizing with the clock after turning a power on, after a low-power standby or after an initialization, followed by starting a command reception.

19 Claims, 9 Drawing Sheets

| TERMINAL NAME | FUNCTION |
|---|---|
| CK | USER-USE CLOCK |
| CE | USER-USE CHIP ENABLE |
| WE | USER-USE WRITE ENABLE |
| A[t-1:0] | USER-USE INPUT ADDRESS |
| I[b-1:0] | USER-USE INPUT DATA |
| BWEB[b/8-1:0] | USER-USE PARTIAL WRITE ENABLE |
| SHTDWN | USER-USE LOW POWER STNADBY ENABLE |
| RSTB | USER-USE RESET |
| ZZB | USER-USE IDLE ENABLE |

F I G. 1 A

| TERMINAL NAME | FUNCTION |
|---|---|
| A[b-1:0] | USER-USE OUTPUT DATA |

F I G. 1 B

真理値表

| SHTDWN | RSTB | CK | ZZB | CE | WE | IA | BWEB | OPERATION MODE | A | memory cell |
|---|---|---|---|---|---|---|---|---|---|---|
| H | | running | | H | | | | LOW POWER STNADY | OUTPUT X | BREAK ALL CELL DATA |
| H | | | | LX | | | | HANG UP | OUTPUT X | BREAK ALL CELL DATA |
| L | L | running | | | | | | INITIALIZE | OUTPUT X | BREAK ALL CELL DATA |
| L | H | running | L | | | | | IDLE | NO CHANGE | NO CHANGE |
| L | H | running | H | X | | | | HANG UP | OUTPUT X | BREAK ALL CELL DATA |
| L | H | running | H | H | | | | REFRESH | NO CHANGE | NO CHANGE |
| L | H | running | H | L | H | LH | | READ | READ FROM A SPECIFIED ADDRESS | NO CHANGE |
| L | H | running | H | L | H | LH | X | READ | READ FROM A SPECIFIED ADDRESS | NO CHANGE |
| L | H | running | H | L | L | LH | LH | WRITE | NO CHANGE | WRITE TO A SPECIFIED ADDRESS |
| L | H | running | H | L | L | LH | L | (WRITE) | NO CHANGE | BREAK CELL DATA OF SPECIFIED ADDRESS |
| L | H | running | H | L | L | LH | H | NO WRITE OPERATION | NO CHANGE | NO CHANGE |
| L | H | running | H | L | L | LH | X | (WRITE) | NO CHANGE | BREAK CELL DATA OF SPECIFIED ADDRESS |
| L | H | running | H | L | HX | X | | | OUTPUT X | BREAK ALL CELL DATA |
| L | H | running | H | L | L | X | H | | NO CHANGE | NO CHANGE |
| L | H | running | H | L | X | LH | LX | | OUTPUT X | BREAK CELL DATA OF SPECIFIED ADDRESS |
| L | H | running | H | L | X | LH | | HANG UP | OUTPUT X | BREAK ALL CELL DATA |
| X | X | | H | | | | | HANG UP | OUTPUT X | BREAK ALL CELL DATA |
| L | | X | | | | | | HANG UP | OUTPUT X | BREAK ALL CELL DATA |
| L | H | | X | | | | | HANG UP | OUTPUT X | BREAK ALL CELL DATA |

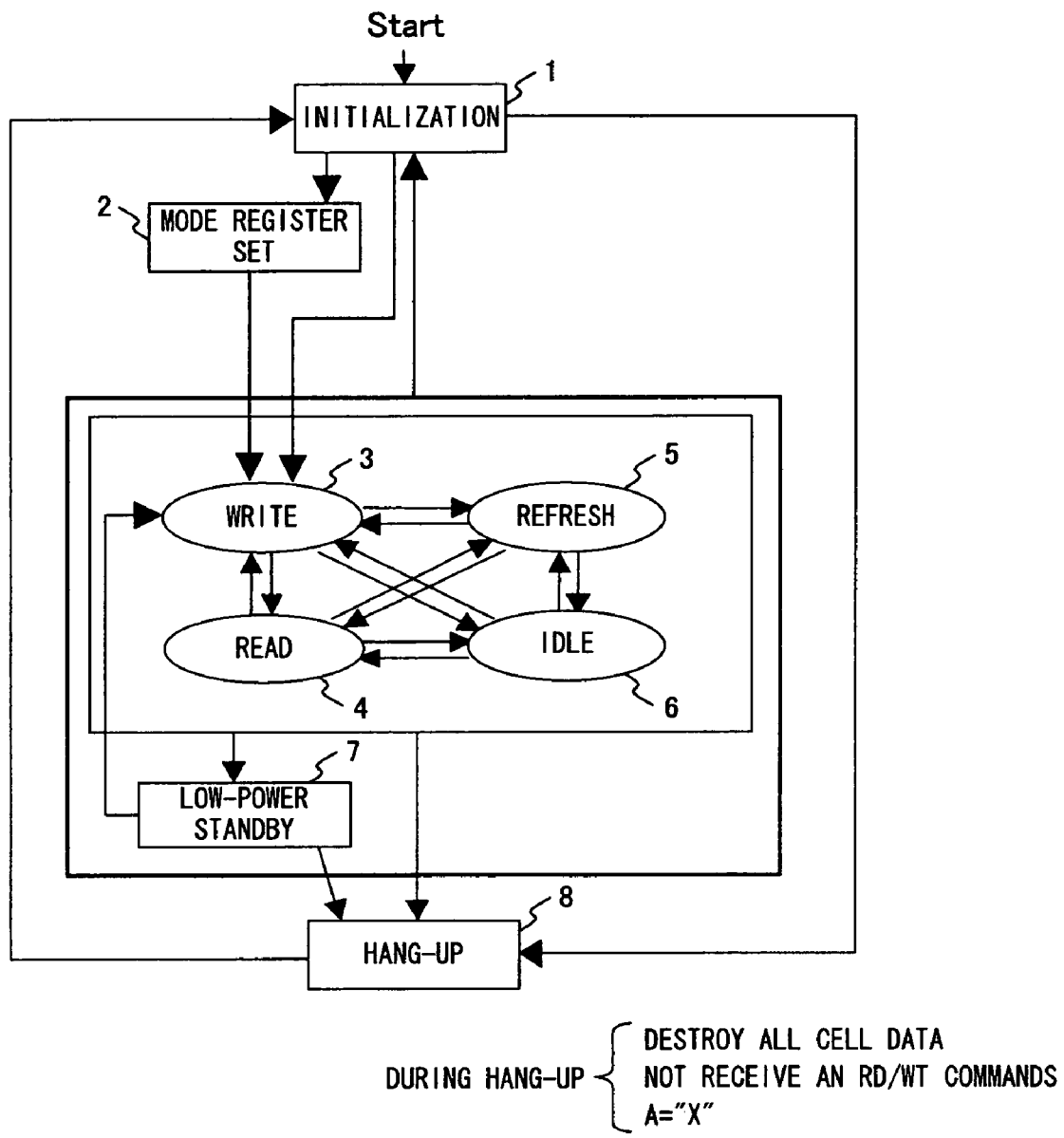
F I G. 8

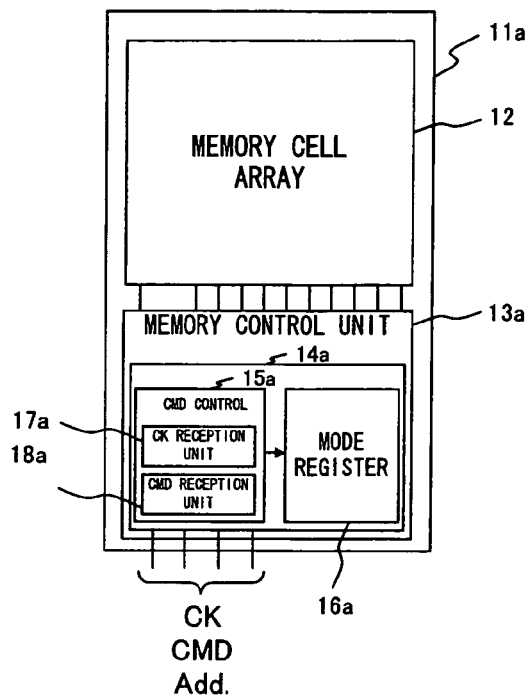
F I G. 9 A
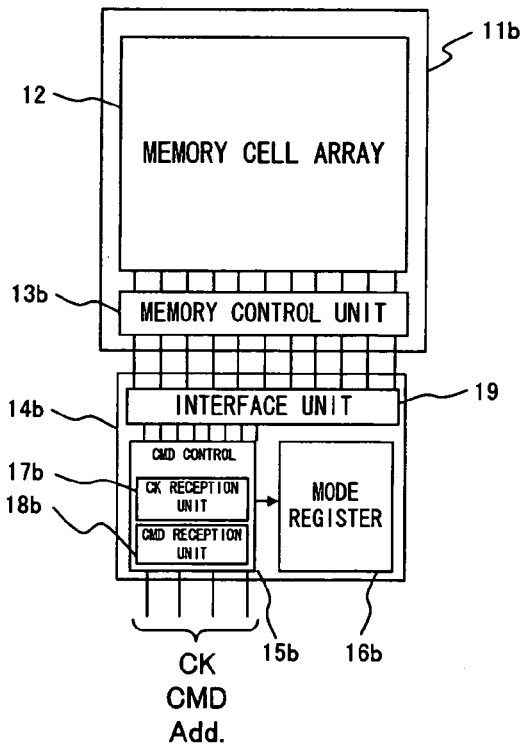
F I G. 9 B

SEMICONDUCTOR MEMORY, MEMORY CONTROLLER AND CONTROL METHOD FOR SEMICONDUCTOR MEMORY

CROSS-REFERENCE TO RELATED APPLICATIONS

This application is based upon and claims the benefit of priority from the prior Japanese Patent Application No. 2006-020427 filed on Jan. 30, 2006, the entire contents of which are incorporated herein by reference.

BACKGROUND OF THE INVENTION

1. Field of the Invention

The present invention relates to a technique for controlling semiconductor memory of a synchronous transfer system.

2. Description of the Related Art

A burst transfer for raising a transfer speed by partially eliminating procedures such as specifying an address is one of effective means for improving a data transfer rate of semiconductor memory when transferring continuous data synchronously with a clock signal.

For instance, a patent document 1 (Laid-Open Japanese Patent Application Publication No. 10-199233) has disclosed a method for implementing a burst transfer for EDO (extended data out) memory, which primarily performs an asynchronous transfer, by using a signal used for the EDO memory.

Synchronous DRAM (SDRAM), i.e., generic DRAM, operates when a BL (Burst Length) as one of setup values used for a burst transfer is equal to or greater than two for example, and a value of the BL can be controlled by a Mode Register Set (MRS) command.

Since control commands such as the MRS command can be input at a discretionary clock, a user is required to utilize SDRAM with an appropriate attention under various limitations such as timing. For example, the user is required to use it by considering a limitation of intervals when continuously accessing the same bank, that of intervals for being able to input an RD (Read) command from an active command, et cetera.

Incidentally, for a setup value BL, the present specification defines that the case of inputting and outputting data for the duration of N clocks by one RD (Read)/WT (Write) command is BL=N.

A memory controller managing a control of memory is required to control SDRAM so as to satisfy various constraint conditions, making its design difficult.

Meanwhile, if a design is tried by describing such a specification by a hardware description language such as Verilog and VHDL (VHSIC (very high speed integrated circuit) description language), a description content becomes complex due to a cumbersomeness of the control. Because of this, not only the description per se is difficult, but also an identification of the description with a specification is difficult to validate. Therefore, adoption of the specification as a logic mixed memory macro levies great loads on both a macro designer (i.e., a describer of Verilog/VHDL) and a macro user.

SUMMARY OF THE INVENTION

The purpose of the present invention is to provide a memory control technique for enabling easy designs of semiconductor memory and a memory controller for controlling the memory for the semiconductor memory carrying out a synchronous transfer.

According to the present invention, semiconductor memory, premising the one for inputting and outputting data synchronously with a clock, comprises a clock reception unit and a command reception unit.

The clock reception unit receives the clock.

The command reception unit initially receives a first specific command synchronizing with the clock after turning a power on, after a low-power standby or after an initialization, followed by starting a command reception.

The first specific command is a Write command for example, and simplification of a command reception makes it possible to simplify a configuration of a circuit used for a control.

An alternative configuration may be such that the command reception unit receives a command at every N clocks with a clock at which the first specific command is initially received being the basic point in time when the semiconductor memory inputs and outputs data for a duration of N clocks corresponding to a Read/Write command synchronizing with the clock.

As such, the configuration for receiving a command only at every specific clock starting from the basis enables simplification of a circuit control.

Another alternative configuration may further be such that the command reception unit recognizes a second specific command received prior to initially receiving said first specific command as a command which defines an operation mode setup of the semiconductor memory.

This configuration makes it possible to separate between a control for defining an operation mode of the semiconductor memory and that for reading/writing data, thereby simplifying a control configuration.

Another possible alternative configuration is such that the command reception unit receives the second specific command when one or more command constituting a key prior to an input of the second specific command.

This configuration is capable of preventing an erroneous change of an operation mode setup for the semiconductor memory.

The present invention includes not only semiconductor memory but also a memory controller connected thereto and a control method therefor, within the scope of the present invention.

The present invention enables easy designs of semiconductor memory and of a memory controller, and additionally simplification of the related circuit configurations. This in turn enables a design and a validation thereafter to be easy.

BRIEF DESCRIPTION OF THE DRAWINGS

FIG. 1A is a chart exemplifying an input signal of memory according to the present embodiment;

FIG. 1B is a chart exemplifying an output signal of memory according to the present embodiment;

FIG. 2 is a chart exemplifying an active truth table corresponding to a state of an input signal;

FIG. 8 is a diagram exemplifying transitions of operation states of memory according to the present embodiment; and FIG. 9A and FIG. 9B are block diagrams of memory according to the present embodiment.

DESCRIPTION OF THE PREFERRED EMBODIMENTS

Figure 3A:
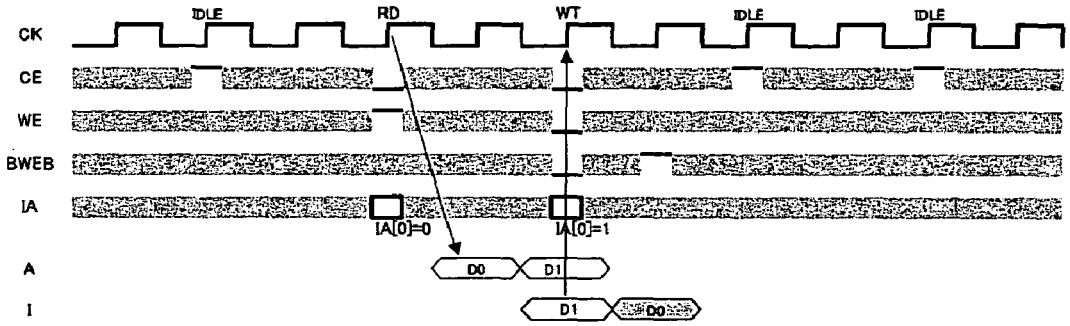
FIG. 3A and FIG. 3B are charts each exemplifying an operation timing according to the present embodiment.

The following is a description of the preferred embodiment of the present invention by referring to the accompanying drawings.

FIG. 1A is a chart exemplifying an input signal of memory according to the present embodiment; and FIG. 1B is a chart exemplifying an output signal of the memory according thereto. FIG. 2 is a chart exemplifying an active truth table corresponding to a state of an input signal.

According to the examples shown by FIGS. 1A and 1B, the memory used in the present embodiment comprises a clock CK, a chip enable CE, a Write enable WE, an input address IA [t−1: 0] (t denotes an address width), input data I [b−1: 0] (b denotes a data width), a partial Write enable BWEB [b/8−1: 0], a low power standby enable SHTDWN, a reset RSTB and an idle enable ZZB as input signals; and comprises output data A [b−1: 0] as an output signal.

Among these, the clock CK is a clock signal used for synchronizing at the time of inputting and outputting data or command to and from the memory. Note that the memory inputs and outputs data or a command synchronously with the rise edge of a clock CK in the following description, the memory according to the present embodiment, however, may be configured to input and output data synchronously with the fall edge of a clock CK, or with both the rise and fall edges thereof.

The chip enable CE is a negative logic signal for receiving a Read/Write instruction at low as shown in FIG. 2. The write enable WE is a negative logic signal indicating a Read at high and a Write at low.

The partial write enable BWEB is for putting mask to a specific bit per byte against a Write when writing to the memory. The low power standby enable SHTDWN is a signal for making the memory in a low-power standby mode, putting it in the minimum power consumption mode without retaining data when the signal is high. The reset RSTB is a signal for resetting the memory for initialization. The idle enable ZZB is a signal for making the memory in an idle (IDL) state at low.

The next description is of an outline of a memory control according to the present embodiment.

The present embodiment is configured to put a limitation to timing for receiving a command in order to implement a memory controller allowing a simple description by a hardware description language, that is, having a small circuit size, and enabling an easy validation of a design and of a description content written by the hardware description language.

For instance, for the BL being equal to 2 (two), a conventional SDRAM received new command any time after two clocks after receiving a command, whereas the memory according to the present embodiment is configured to receive a command only at every two clocks. Setting such a limitation uniquely determines a supposed pattern, thereby making the circuit configuration simple and enabling an easy validation of a description content written by the hardware description language.

FIG. 3 shows charts each exemplifying an operation timing of the semiconductor memory according to the present embodiment. The drawings show usual Read and Write operations.

Note that FIG. 3 exemplifies the case of Read Latency (RL)=1, and Write Latency (WL)=0. When RL=1, Read data is output so as to enable data to be imported at the timing of the next clock following a provision of an RD (Read) command, and when WL=0, Write data is input at the timing of the same clock as a WT (Write) command.

FIG. 3A shows the case of BL=2, where the memory according to the present embodiment is configured to receive an RD and a WT commands at every two clocks. Likewise, in the case of BL=4 shown by FIG. 3B, the memory receives a command at every four clocks. And the memory is configured to not receive a command at other clock timings except for a low power standby command and an initialization command.

In FIG. 3A for example, commands are received only at every two clocks, i.e., an Idle command, an RD command, a WT command, et cetera, while no command is received at the timing of one clock between commands. Likewise in FIG. 3B, commands are received only at every four clocks, i.e., an RD command, a WT command, an Idle command, et cetera, while no command is received at other timings.

As such, simplification of a clock timing specification for a command reception enables an easy design of a memory controller for controlling the memory, and an easy description of a memory operation specification by a hardware description language, such as Verilog and VHDL, and an easy verification thereof.

Note that the setup value of a BL shall preferably be set to a value of $2^k$, such as 2, 4, 8, et cetera. This stems from a k being equal to the number of address signals IA which becomes unnecessary according to a BL setting.

Figure 3B:
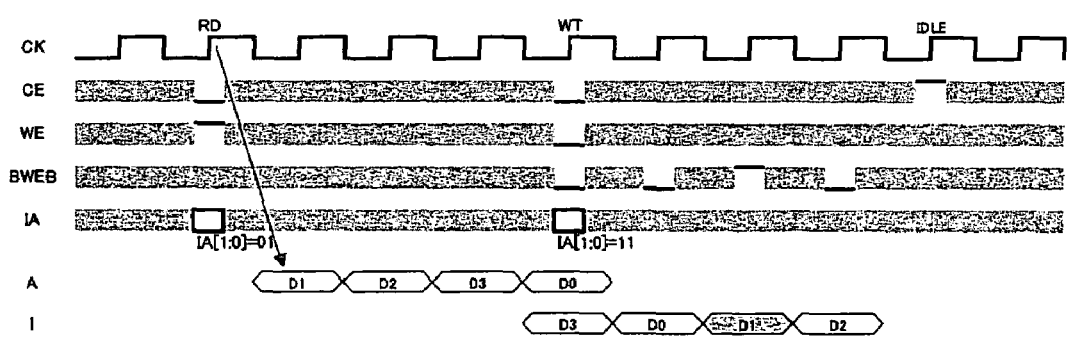

Incidentally in FIG. 3, as a BWEB signal is input at the time of a WT command execution, the data written is masked, and therefore the data writing is not carried out. In FIG. 3A for example, the data D0 is not written to a memory cell, while in FIG. 3B, the data D1 is not written to a memory cell.

Figure 4:
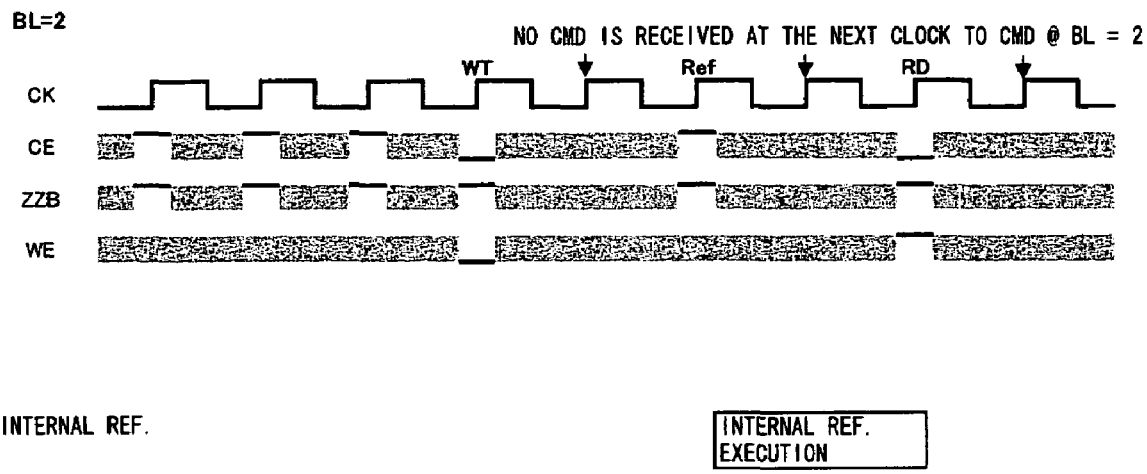
FIG. 4 is a chart exemplifying an operation timing immediately after an initialization of semiconductor memory according to the present embodiment.

FIG. 4 is a chart exemplifying an operation timing immediately after an initialization of semiconductor memory according to the present embodiment.

When BL=2 for example, commands are received at every two clocks as described above, the basic point in time needs to be clarified. The memory according to the present embodiment is configured to make the initial WT command following an initialization the basic point for a command reception.

Incidentally, an RD command or a refresh (Ref) command may be made a basic point for a command reception, in place of the WT command. However, data needs to be first written in order to use the memory and therefore it is desirable to make a WT command the basic point. Making the first WT command the basic point enables a provision of a function other than the original function to other commands during the time until an initial WT command is input. This point of view is described later.

In the example shown by FIG. 4, an RD command and Ref command are ignored until an initial WT command is input after initializing the memory, and therefore an idle state is maintained.

Then, as an initial WT command is input to the memory, a command is received at every two clocks if BL=2, or every four clocks if BL=4, sequentially, from the basic point at which the aforementioned WT command has been received.

FIG. 4 exemplifies the case of BL=2, where the initial WT command is input, followed by the Ref command, RD command, et cetera, being sequentially received at every two clocks with the clock at which the aforementioned WT command has been received being the reference, while no command is received at timings of one clock between commands.

Note that FIG. 4 exemplifies the case of making a WT command initially received after initializing the semiconductor memory the reference, a WT command initially received not only after an initialization but also after turning the power on or during a low-power standby mode can likewise be made a reference for a command reception.

The configuration is also such that a once set clock constituting a reference is initialized by either of an initialization, a low-power standby and turning a power on.

The next description is of the case of providing a command with a function other than the original function when another command is input prior to being input by a specific command (e.g., a WT command), shown in FIG. 4, which constitutes a reference.

The memory according to the present embodiment is configured to have the capability of providing for instance an RD command, which is input prior to being input by an initial WT command constituting a reference, with another function, e.g., the function as command for performing various setups of the memory in the same manner as an MRS command of SDRAM.

In this case, if an RD command is input prior to being input by an initial WT command, it is possible to carry out not only a setup of a value of BL, RL and WL but also a change of an internal operation timing, an adjustment of an internal generation voltage, et cetera, for evaluation, from an address code that is simultaneously input.

Figure 5:
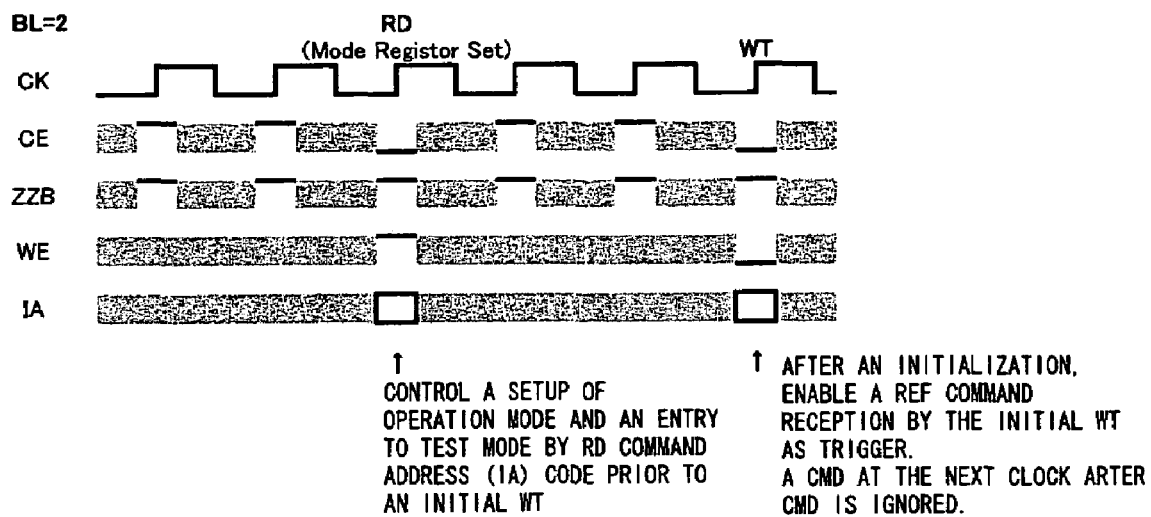
FIG. 5 is a chart showing the case of providing a function as MRS command vis-à-vis a command input prior to a command constituting a first reference being input.

FIG. 5 exemplifies such a case.

FIG. 5 shows the case of making a WT command a reference, and providing an RD command, which is input prior to being input by an initial WT command, with the function as a command (this command is noted as MRS command in the following description) for setting a value in a register which sets various setup values such as BL and RL for the memory.

The case of FIG. 5 makes an RD command input prior to an initial WT command an MRS command, and specifies a setup value for a register by an address code which has simultaneously been input.

For example, the case correlates a setup content with each address code, such as specifying setup values of BL for the address codes A0 and A1 and those of RL for the address codes A2 and A3 for example, in advance, followed by setting these setup values by address codes which are input together with an RD command.

This configuration makes it possible to perform various setups for the memory before a data read/write to/from the memory is started.

And what are possible to set by the MRS command may be not only BL, RL and WL, but also other setups for evaluation, including an internal timing of a device and a voltage level of an internal generation power source for example.

Figure 6:
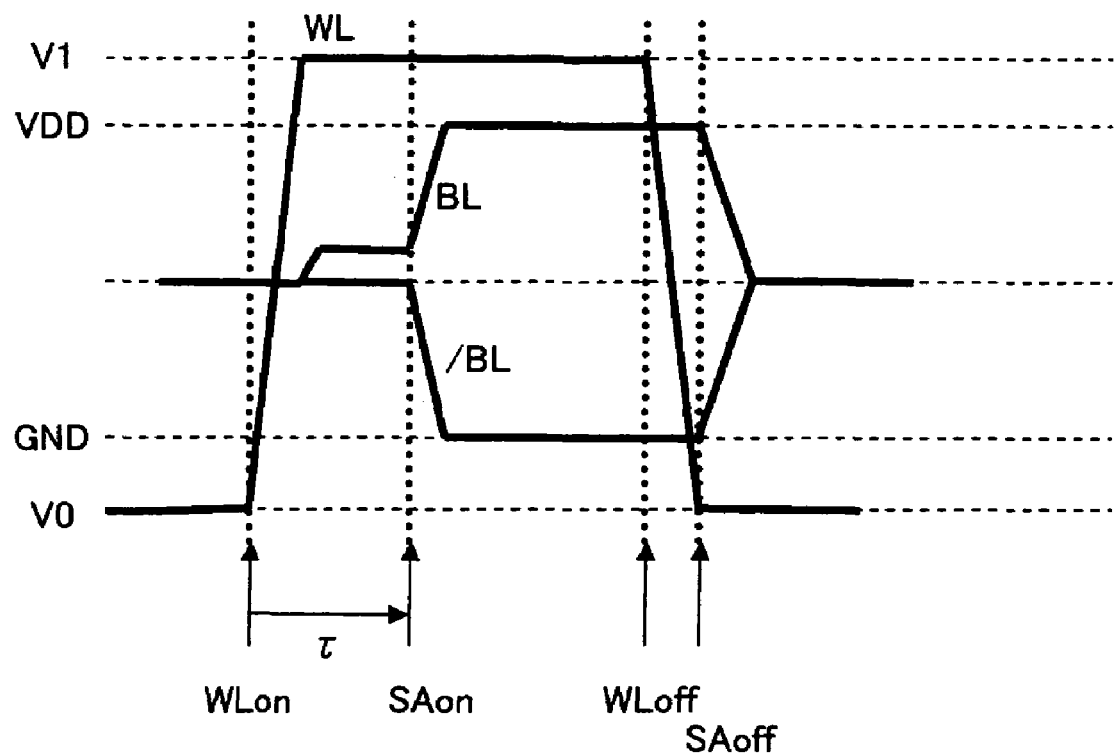
FIG. 6 is a diagram showing a timing chart at the time of reading data of a typical DRAM.

FIG. 6 is a diagram showing a timing chart at the time of reading data of a typical DRAM.

Referring to FIG. 6, the WL indicates a word line (i.e., a line selection line); the BL and "/BL" indicate bit lines,; the VDD indicates a power source voltage level; the GND indicates a ground level; and the V0 and V1 indicate voltage levels of an internal generation.

Data in a memory cell selected by the word line WL is read as a result of the data being amplified by a sense amplifier SA after a period of τ, during which the data is read by the bit line BL and /BL, passes, and then the word line WL is turned off, followed by resetting (i.e., turning off) the sense amplifier SA.

Voltage levels of the voltages V0 and V1, a rise timing WLon and a fall timing WLoff of the word line WL, and timing SAon/SAoff for setting/resetting the sense amplifier SA are important parameters for designing DRAM.

If the level and timing can be freely changed by an MRS, it is effective for evaluating the produced memory.

As a method for the setting, the above described voltage level and/or internal timing are set by an MRS command. An example configuration is such that apart of address codes (e.g., addresses A6 and A7), which are input simultaneously with an MRS command, is correlated as a value for setting a voltage level of the V0, followed by selecting a voltage level to be set to the V0 from among the four voltages, i.e., $V0_1$, $V0_2$, $V0_3$ and $V0_4$, according to a value of the address code.

It is possible to obtain information such as a design margin relating to a device by comparing evaluation results obtained by changing these voltage levels and internal timings.

As described above, the present embodiment is configured to limit so as to carry out various setups for the memory prior to being input by a specific command (e.g., a WT command) after turning a power on or an initialization, and therefore a circuit configuration of a memory controller for controlling the memory is simpler than one for the conventionally configured memory, and a design and a verification thereafter are proportionately easier.

Note that the function according to the mode register set mode is the one mainly used for a device evaluation, et cetera, which sometimes includes a function useless for a memory user. In such a case, it may be configured such that an MRS command normally does not function by way of a metal option, et cetera, in order to prevent the user from erroneously entering a mode register set mode which changes a setup by an MRS command.

It is also possible to equip a key for entering the mode register set mode in order to inhibit an erroneous use of the aforementioned mode.

FIG. 7 is for describing an operation of such a case.

FIG. 7 also exemplifies the case of making a WT command a reference, and providing an RD command, which is input prior to being input by an initial WT command, with the function as an MRS command for setting a value in a register which sets various setup values such as BL and RL for the memory.

Figure 7A:
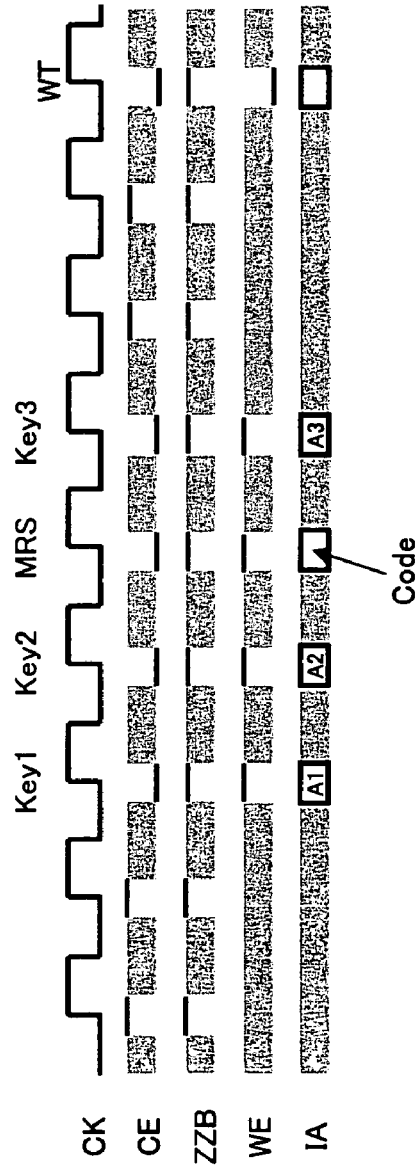
FIG. 7A and FIG. 7B are diagrams each describing the case of equipping a key for the purpose of entering a mode register set mode.

In the case exemplified by FIG. 7A, a setup value is not changed by entering a mode register set mode unless four consecutive RD commands are input prior to being input by a WT command constituting a reference. And the first two among the four RD commands are keys (i.e., a key 1 and a key 2) for examining whether or not a value of an address code at the time of inputting the keys identifies with a predefined specific value, recognizing an RD command input in the third place as an MRS command if the address code identifies with the specific value and not receive the RD command input in the third place as an MRS command if the address code does not identify therewith.

And an RD command in the fourth place following the MRS command in the third place is also a key command (i.e., a key 3) for setting a setup value specified by the MRS command actually to the memory only if an address code of the key 3 identifies with the specific value.

Incidentally, the configuration is such that the two keys, i.e., the keys 1 and 2, must be passed for receiving an MRS command in FIG. 7, the number of the keys, however, may be one, or more than two.

Another configuration may be such that an input of an MRS command in the third place is immediately followed by a setup value being set to a register with in memory, in lieu of equipping with a key 3.

Figure 7B:
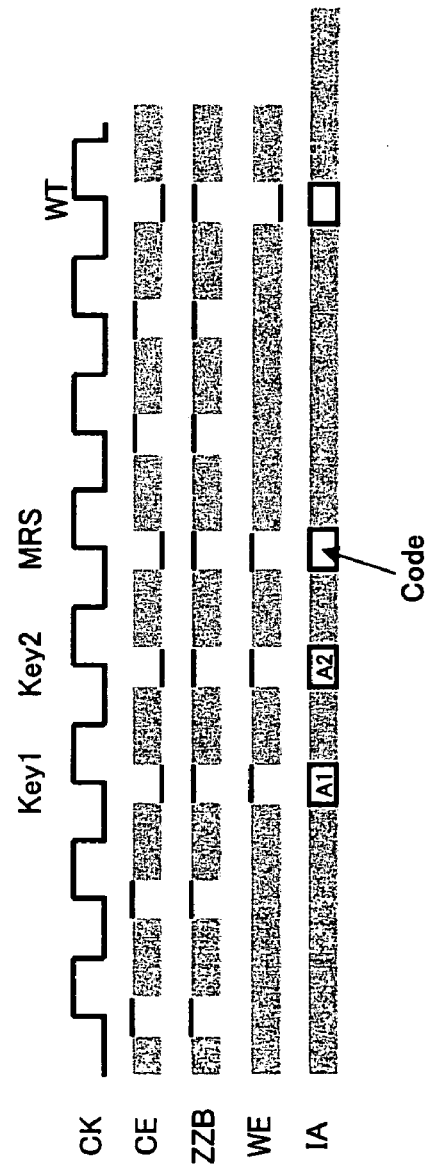

FIG. 7B exemplifies such a case.

In the case of FIG. 7B, if an address code identifies with a specific value in the keys 1 and 2, a value specified by an address code, which is input together with an MRS command, is set to the memory as a setup value at the time of inputting an MRS command input thereafter.

Such a configuration of equipping keys for preventing an erroneous setup enables a prevention of an erroneous setup for the memory.

FIG. 8 is a diagram exemplifying transitions of operation states of memory according to the present embodiment.

Referring to FIG. 8, the Start means turning a power on, and the memory according to the present embodiment transitions to a Write mode (WT) 3 by a WT command after an initialization model. The Write mode 3 is a mode for writing data to the memory. It is possible to freely transition from the Write mode 3 to a Read mode (RD) 4 for reading data, a Refresh mode (Ref) 5 for performing refreshing processing and an Idle (IDLE) 6 for retaining data by the respective commands. It is also possible to transition from the four modes to a low-power standby mode 7 for suppressing a power consumption to a minimum without retaining data, and also therefrom to a Write mode 3. It is further possible to transition from the five modes and initialization mode to a hang-up mode 8 for destructing all memory cell data and not receiving an RD/WT commands, and also therefrom to the initialization mode 1.

A configuration may be so as to transition from the initialization mode 1 to a mode register set mode 2 for performing various setups for the memory. And it is possible to transition from the mode register set mode 2 to the Write mode 3.

Note that inputs of signals to the SHTDWN and RSTB terminals shown in FIG. 1 transition to the initialization mode 1 and low-power standby mode 7. These signals are asynchronous signals which do not synchronize with a clock CK.

Meanwhile, a specific command constituting a reference (i.e., a WT command), which has been described by referring to FIG. 4, corresponds not only to an initial WT command after an initialization mode but also to an initial WT command after a low-power standby mode as shown in the state transition diagram of FIG. 8.

FIG. 9 shows block diagrams of the memory according to the present embodiment.

Memory 11a according to the present embodiment includes a memory cell array 12 comprising a memory cell and a selection circuit for selecting a memory cell, and comprises a memory control unit 13a for controlling the memory cell array 12, with a memory controller 14a for controlling the above described memory being placed within the memory control unit 13a. The memory controller 14a comprises a CMD control 15a for controlling an operation of the memory by a command that is externally received, and a Mode register unit 16a for determining an operation mode by selecting one from a plurality of operation modes. The CMD control 15a comprises a CK reception unit 17a for receiving a clock and a CMD reception unit 18a for receiving a command.

Also as shown by FIG. 9B, a controller 14b according to the present embodiment may be configured to externally equipped with a generic use memory 11b comprising a memory array 12 and a memory control unit 13b. In such a case, the controller 14b comprises an interface unit 19 for managing a connection with the generic use memory 11b, in addition to the CMD control 15 and a Mode register unit 16b.

In the configuration shown by FIG. 9B, another configuration may be so as to place the Mode register unit 16b on the side of the generic use memory 11b.

As described above, the memory controller according to the present embodiment can be implemented as a part of memory, or as a configuration for externally connected to generic use memory such as SDRAM.

Note that the above description is provided by limiting memory according to the present embodiment to DRAM, the memory according thereto may be other types of memory provided that they are for inputting and outputting data synchronously with an input clock, such as SRAM, in lieu of being limited to the DRAM.

What is claimed is:

1. Semiconductor memory for inputting and outputting data synchronously with a clock, comprising:
   a clock reception unit for receiving the clock; and
   a command reception unit for initially receiving a first specific command synchronizing with the clock after turning a power on, after a low-power standby or after an initialization, followed by starting a command reception,
   wherein the command reception unit receives a command at every N clocks after the first specific command is initially received,
   wherein N is an integer and greater than 1 (one), and
   wherein said command reception unit invalidates a command which is different from the first specific command and is received prior to initially receiving said first specific command.

2. The semiconductor memory according to claim 1, wherein said first specific command is a Write command.

3. The semiconductor memory according to claim 1, wherein data for a duration of N clocks corresponding to a Read/Write command is input and output in synchronization with the clock.

4. The semiconductor memory according to claim 3, wherein said N is equal to 2.sup.k, where k is an integer being equal to or greater than 1 (one).

5. The semiconductor memory according to claim 3, wherein a clock is initialized at one of an initialization, a low-power standby and turning a power on.

6. The semiconductor memory according to claim 1, wherein said command reception unit recognizes a second specific command received prior to initially receiving said first specific command as a command which defines an operation mode setup of the semiconductor memory.

7. The semiconductor memory according to claim 6, wherein said operation mode setup includes a setup of Burst Latency (BL).

8. The semiconductor memory according to claim 6, wherein said operation mode setup includes a setup of Read Latency (RL).

9. The semiconductor memory according to claim 6, wherein said operation mode setup includes a setup of Write Latency (WL).

10. The semiconductor memory according to claim 6, wherein said operation mode setup includes a setup of an internal timing or an internal voltage level of the semiconductor memory.

11. The semiconductor memory according to claim 6, wherein said second specific command is a Read command.

12. The semiconductor memory according to claim 6, wherein said command reception unit receives said second specific command when one or more command constituting a key prior to an input of the second specific command.

13. The semiconductor memory according to claim 12, wherein said command reception unit receives said second specific command when an address code which is input together with a command constituting said key identifies with a specific value.

14. The semiconductor memory according to claim 6, wherein an operation mode setup for the semiconductor memory by said second specific command is validated when a command constituting a key is input after inputting the second specific command.

15. The semiconductor memory according to claim 6, wherein an operation mode setup for the semiconductor memory by said second specific command is validated at the time of inputting the aforementioned second specific command.

16. The semiconductor memory according to claim 6, further comprising a mode register for setting an operation mode of the semiconductor memory, wherein an operation mode setup for the semiconductor memory by said second specific command is set in the mode register.

17. A memory controller connected to semiconductor memory for inputting and outputting data synchronously with a clock, comprising:
 a clock reception unit for receiving the clock; and
 a command reception unit for initially receiving a first specific command synchronizing with the clock after turning a power on, after a low-power standby or after an initialization, followed by starting a command reception,
 wherein the command reception unit receives a command at every N clocks after the first specific command is initially received,
 wherein N is an integer and greater than 1 (one), and
 wherein said command reception unit invalidates a command which is different from the first specific command and is received prior to initially receiving said first specific command.

18. The memory controller according to claim 17, wherein data for a duration of N clocks corresponding to a Read/Write command is input and output in synchronization with the clock.

19. A control method used for semiconductor memory for inputting and outputting data synchronously with a clock, comprising:
 receiving the clock;
 invalidating a command which is different from a first specific command and is received prior to initially receiving said first specific command,
 initially receiving the first specific command synchronizing with the clock after turning a power on, after a low-power standby or after an initialization, followed by starting a command reception; and
 receiving a command at every N clocks after the first specific command is initially received,
 wherein N is an integer and greater than 1 (one).

* * * * *